United States Patent
Kawata et al.

(12)

(10) Patent No.: US 6,314,022 B1
(45) Date of Patent: Nov. 6, 2001

(54) NONVOLATILE SEMICONDUCTOR MEMORY DEVICE AND METHOD FOR MANUFACTURING THE SAME, MICROCOMPUTER-MIXED FLASH MEMORY AND METHOD FOR MANUFACTURING THE SAME

(75) Inventors: Masato Kawata; Tsutomu Tashiro, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/615,524

(22) Filed: Jul. 13, 2000

(30) Foreign Application Priority Data

Jul. 15, 1999 (JP) .................................................. 11-201270

(51) Int. Cl.$^7$ .................................................... G11C 16/04
(52) U.S. Cl. ................................ 365/185.05; 365/185.11; 365/185.12
(58) Field of Search .......................... 365/185.05, 185.11, 365/185.12

(56) References Cited

U.S. PATENT DOCUMENTS 5,305,272 * 4/1994 Matsuo et al. ........................ 365/208
5,729,491 * 3/1998 Kim et al. ........................ 365/185.05

* cited by examiner

*Primary Examiner*—Huan Hoang

(57) ABSTRACT

A nonvolatile semiconductor memory device including a plurality of memory cells connected in parallel with each other, each of which has a memory transistor and a selecting transistor connected in series between a bit line and a source electrode, in such a configuration that information may be, via that bit line, input to and output from any one of the memory cells which is selected by a word line connected to gate electrodes of these two transistors, wherein transistor driving force of one of these two transistors of the memory cell whichever faces the bit line is enhanced. That transistor which faces the bit line is the one which lies on a drain side of the memory cell, that is, a memory transistor.

13 Claims, 16 Drawing Sheets

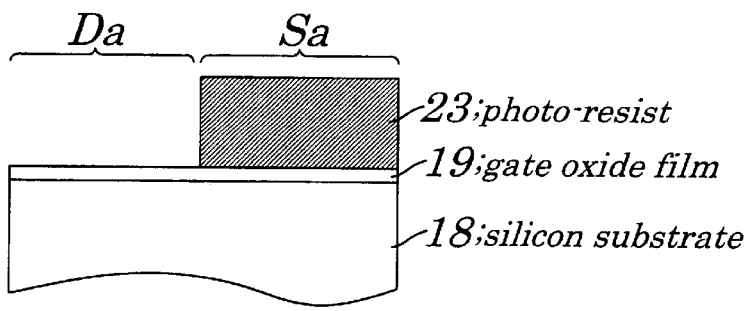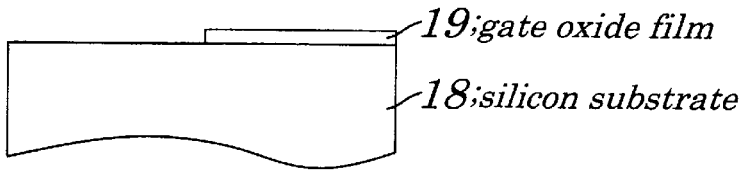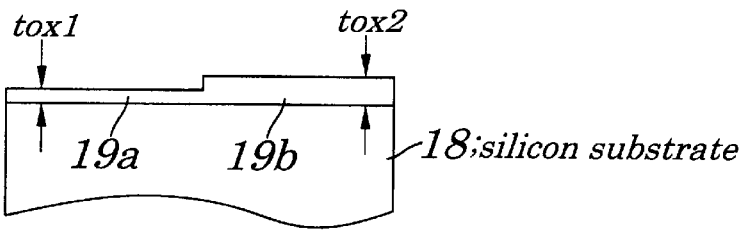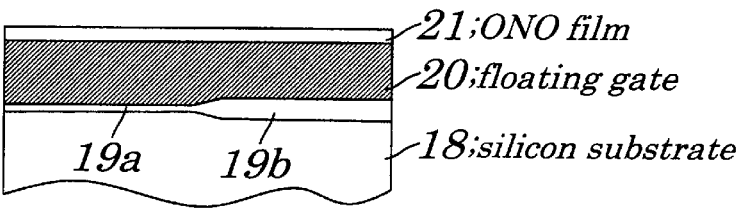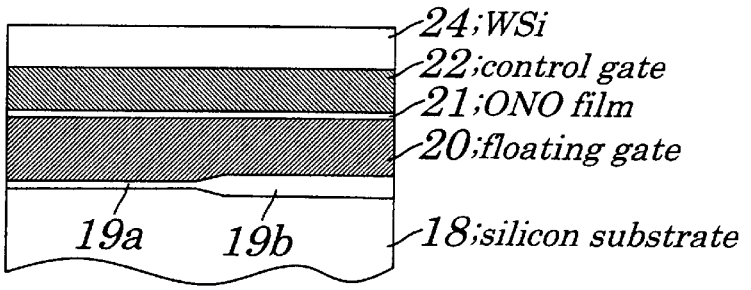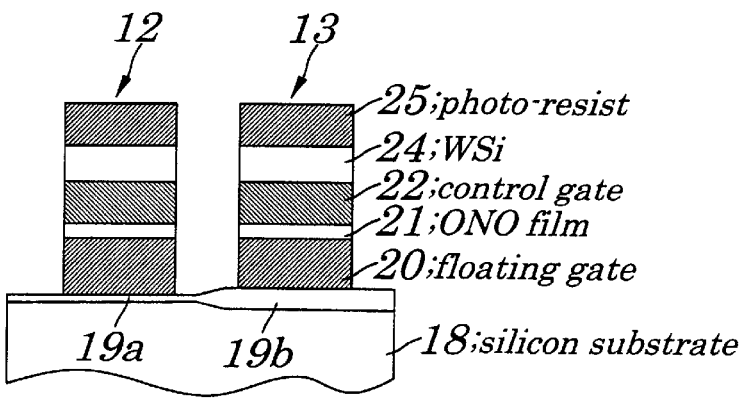

NONVOLATILE SEMICONDUCTOR MEMORY DEVICE AND METHOD FOR MANUFACTURING THE SAME, MICROCOMPUTER-MIXED FLASH MEMORY AND METHOD FOR MANUFACTURING THE SAME

BACKGROUND OF THE INVENTION

1. Field of the Invention

The present invention relates to a nonvolatile semiconductor memory device and a method for manufacturing a same and, more particularly, to the nonvolatile semiconductor memory device used as a one-chip microcomputer-mixed flash memory and the method for manufacturing the same.

2. Description of the Related Art

A nonvolatile semiconductor memory device has conventionally been known in which a plurality of memory cells is connected in parallel with each other each of which has a memory transistor and a selecting transistor which are connected in series between a bit line and a source electrode, in such a configuration that information is, via the bit line, input to and output from one of these memory cells which is selected by a word line connected to gate electrodes of these two transistors. As shown in FIG. 9, a flash memory (nonvolatile semiconductor memory device) 1 includes a word line WLn and a main bit line MBLn, which is in turn connected via a block selecting transistor BST to a sub-bit line SBLn.

Memory cells 1a which form the flash memory 1 are arrayed in a two-transistor type construction for high-speed read-out operations, wherein each of the memory cells 1a has a memory transistor 2 and a selecting transistor 3 which are connected in series between the bit line and a source electrode thereof, so that information may, via the bit line, be input to and output from a memory cell 1a selected by a word line WLn.

The memory transistor 2 and the selecting transistor 3 both have their gate electrode connected to the word line WLn, while the memory transistor 2 has its drain and source connected to the sub-bit line SBLn and the selecting transistor 3 respectively. The main bit line MBLn is connected via a Y-address selector 4 to a sense-amplifier (SA) 4a.

As shown in FIG. 10, in the memory cell 1a, its memory transistor 2 is positioned on a side of the drain D, that is, each pair of the memory transistors 2 is arranged so as to sandwich a contact hole 5, through which the memory cell 1a is connected to the bit line. Outside of each of these memory transistors 2, the selecting transistor 3 is positioned. Note here that a dotted line in the FIG. 10 indicates a region which encloses one memory cell.

As shown in FIG. 11, on a silicon substrate 6 are formed side by side the memory transistor 2 and the selecting transistor 3 of the memory cell 1a. These two transistors make up in combination one memory cell 1a for storing one bit of data.

In a well 6a formed in the silicon substrate 6 are provided a source region S connected to ground (not shown) and a drain D connected to the bit line, between which are formed two channel regions.

The memory transistor 2 and the selecting transistor 3 each have a floating gate FG provided on the silicon substrate 6 with a gate oxide film therebetween and a control gate CG provided on the floating gate FG with an Oxide Nitride Oxide (ONO) film therebetween. The floating gate FG and the control gate CG of the selecting transistor 3 are short-circuited at a predetermined portion (not shown).

Since the memory transistor 2 and the selecting transistor 3 are formed concurrently, they have same parameter values such as a channel width W, a channel length L, a gate film thickness tox, or a like. That is, the two transistors of the memory cell 1a, memory transistor 2 and the selecting transistor 3 have a same channel width (see FIG. 10).

A typical example of read-out operations is described below of such two-transistor type flash memory.

As shown in FIGS. 12A, 12B and 12C, in read-out operations, in such a state that 1.0 [V] is applied to the drain D, 2.5 [V] is applied to gate G of the memory transistor 2 (control gate voltage: Vcg), 2.5 [V] (constant) is applied to the gate G of the selecting transistor 3, and 0.0 [V] is applied to the well W (see FIGS. 12A and 12B), a sense-amplifier (not shown) detects a larger drain current Id when an erased state (threshold=1.0 [V]) is read out and a smaller drain current Id when a written-in state (threshold=5.0 [V]) is read out (see FIG. 12C), to decide "0" and "1" respectively.

These written-in and erased states are, as described above with reference to read-out operations, discriminated from each other based on a difference in threshold of the memory transistor 2, that is that in the written-in state is 5.0 [V] and that in the erased state is 1.0 [V]. This difference in the threshold is given by changing an amount of charge stored in a floating gate.

The more negative charge stored in the floating gate, the threshold rises higher, while more positive charge stored therein, the the threshold falls lower. That is, in the above-mentioned case, a write-in operation equals to inject electrons into the floating gate, while an erasure operation equals to release the electrons stored in the floating gate. This method for injecting/releasing electrons may be a method of utilizing an FN current via a gate oxide film and an ONO film or a method of using a hot carrier.

Note here that in such a flash memory 1 as described above, larger a read-out current in an erased state, higher is a read-out speed (access speed), so that to enhance access speed, the read-out current needs to be increased.

As shown in FIG. 13, if, to read out the memory cell 1a, for example, about 1.0 [V] is applied to the drain D and a power supply voltage of 2.5 [V] is applied to the gates of the memory transistor 2 and the selecting transistor 3, voltages applied between the source and the drain of each of the transistor 2 and transistor 3 are divided so as to total to 1.0 [V]. Therefore, assuming a the source-drain voltage of the selecting transistor 3 to be Vc [V], that of the memory transistor 2 is (1−Vc) [V].

With this, the memory transistor 2 and the selecting transistor 3 are separated from each other, so that the source-drain voltage of the selecting transistor 3 is varied from 0.0 [V] to 1.0 [V] to check its properties (see FIG. 13), thus measuring a read-out current I flowing through the memory transistor 2 and the selecting transistor 3.

As shown in FIG. 14, the read-out current I through the selecting transistor 3 increases as variable voltage Vc rises, while that through the memory transistor 2 is at a maximum when the variable voltage Vc is 0.0 [V] and stops flowing when it is 1.0 [V], that is 0.0 [V] is applied between the source and the drain.

Therefore, an intersection of a load curve of the memory transistor 2 and that of the selecting transistor 3 provides an operating point P of the memory cell 1a, so that a voltage of v1 [V] is applied to the memory transistor 2 and a voltage of v2 [V], to the selecting transistor 3, thus flowing a read-out current (turn-on current) I which corresponds to that operating point P.

However, since the memory transistor 2 and the selecting transistor 3 are formed on a same substrate, a resultant substrate-bias effect of the memory transistor 2 decreases driving force of the memory transistor 2, thus naturally reducing the read-out current I.

If, in this case, as shown in FIG. 15A and FIG. 15B, in a transistor (see FIG. 15A), when, for example, a constant voltage of 1.0 v is applied as drain voltage $V_D$ and 2.5 v is applied as control gate voltage $V_g$, threshold voltage $V_{th}$ of this transistor is as follows:

$$V_{th}=2\phi_f+V_{FB}+[2\epsilon qN (2\phi_f+V_{BS})]^{1/2} \cdot 1/C_o$$

That is, as a voltage is applied to the source, the threshold voltage of the tansistor rises apparently (see FIG. 15B).

Consequently, the current $I_d$ is as follows:

$$I_d=(W/L) \cdot \mu_{eff} C_{ox}[(V_{GS}-V_{th})V_{DS}-(\tfrac{1}{2}) \cdot V_{DS}^2]$$

As can be seen from this equation, as the threshold voltage $V_{th}$ of the transistor increases, the current $I_d$ decreases. A decrease in this read-out current $I_d$ brings about an unbalance state in that a major proportion of source voltage is applied to the memory transistor 2.

SUMMARY OF THE INVENTION

In view of the above, it is an object of the present invention to provide a nonvolatile semiconductor memory device and method for manufacturing same whereby it is possible to enlarge rise-tolerant range and also average a voltage applied to a memory tansistor and selecting transistor and equalize their loads.

According to a first aspect of the present invention, there is provided a nonvolatile semiconductor memory device including a plurality of memory cells connected in parallel with each other each of which has a memory transistor and a selecting transistor connected in series between a bit line and a source electrode, in such a configuration that information may be, via the bit line, input to and output from any one of the memory cells which is selected by a word line connected to gate electrodes of the memory transistor and selecting transistor, wherein driving force of the memory transistor or the selecting transistor whichever faces the bit line is enhanced.

In the foregoing, a preferable mode is one wherein the transistor which faces the bit line lies on a side of a drain of the memory cell.

Also, a preferable mode is one wherein the transistor which lies on the drain side has a shorter channel length than the other transistor which faces a source of the memory cell.

Also, a preferable mode is one wherein a ratio in channel length of the source side transistor and the drain side transistor is about 1:0.25 to 1:0.75.

Also, a preferable mode is one wherein the drain side transistor has a larger channel width than the source side transistor.

Also, a preferable mode is one wherein a ratio in channel width of the source side transistor and the drain side transistor is about 1:1.2 to 1:2.0.

Also, a preferable mode is one wherein a gate oxide film of the drain side transistor is smaller than a gate oxide film of the source side transistor.

Also, a preferable mode is one wherein a ratio in gate oxide film thickness of the source side transistor and the drain side transistor is about 1:0.5 to 1:0.95.

Furthermore, a preferable mode is one wherein driving force of the memory cell is set so that balance in load voltage is kept between the memory transistor and the selecting transistor.

Also, according to a second aspect of the present invention, there is provided a method for manufacturing a nonvolatile semiconductor memory device including a plurality of memory cells connected in parallel with each other each of which has a memory transistor and a selecting transistor connected in series between a bit line and a source electrode in such a configuration that information may be, via the bit line, input to and output from any one of the memory cells which is selected by a word line connected to gate electrodes of the memory transistor and selecting transistor, including a step of forming a gate oxide film of the memory transistor or the selecting transistor of the memory cell whichever faces a drain side smaller than a gate oxide film of one of the memory transistor and selecting transistor which faces a source side.

In the foregoing second aspect, a preferable mode is one wherein the step of forming the gate oxide film includes steps of:
  forming a gate oxide film only in a transistor forming region on a source side of a silicon substrate and then stacking another gate oxide film on the silicon substrate; and
  forming a first gate oxide film on a drain side transistor forming region and a second gate oxide film in a source side transistor forming region.

Also, according to a third aspect, there is provided a method for manufacturing a nonvolatile semiconductor memory device including a plurality of memory cells connected in parallel with each other each of which has a memory transistor and a selecting transistor connected in series between a bit line and a source electrode in such a configuration that information may be, via the bit line, input to and output from any one of the memory cells which is selected by a word line connected to gate electrodes of the memory transistor and selecting transistor, including a threshold-voltage adjustment step of making a threshold voltage of one of the memory transistor and selecting transistor which faces a drain side of the memory cell higher than a threshold voltage of the other transistor which faces a source side of the memory cell.

Also, according to a fourth aspect of the present invention, there is provided a microcomputer-mixed flash memory including in mixture a the nonvolatile semiconductor memory device according to the foregoing first aspect and a microcomputer.

Furthermore, according to a fifth aspect of the present invention, there is provided a method for manufacturing a microcomputer-mixed flash memory by using the nonvolatile semiconductor memory device manufacturing method according to the foregoing second or third aspect, so as to form in mixture a nonvolatile semiconductor memory device and a microcomputer.

BRIEF DESCRIPTION OF THE DRAWINGS

The above and other objects, advantages and features of the present invention will be more apparent from the following description taken in conjunction with the accompanying drawings in which:

FIGS. 6A through 6F are flow diagrams showing respectively processes of manufacturing the memory cell of FIG. 5;

DESCRIPTION OF THE PREFERRED EMBODIMENTS

The following will describe embodiments of the present invention with reference to accompanying drawings.

Figure 1A:
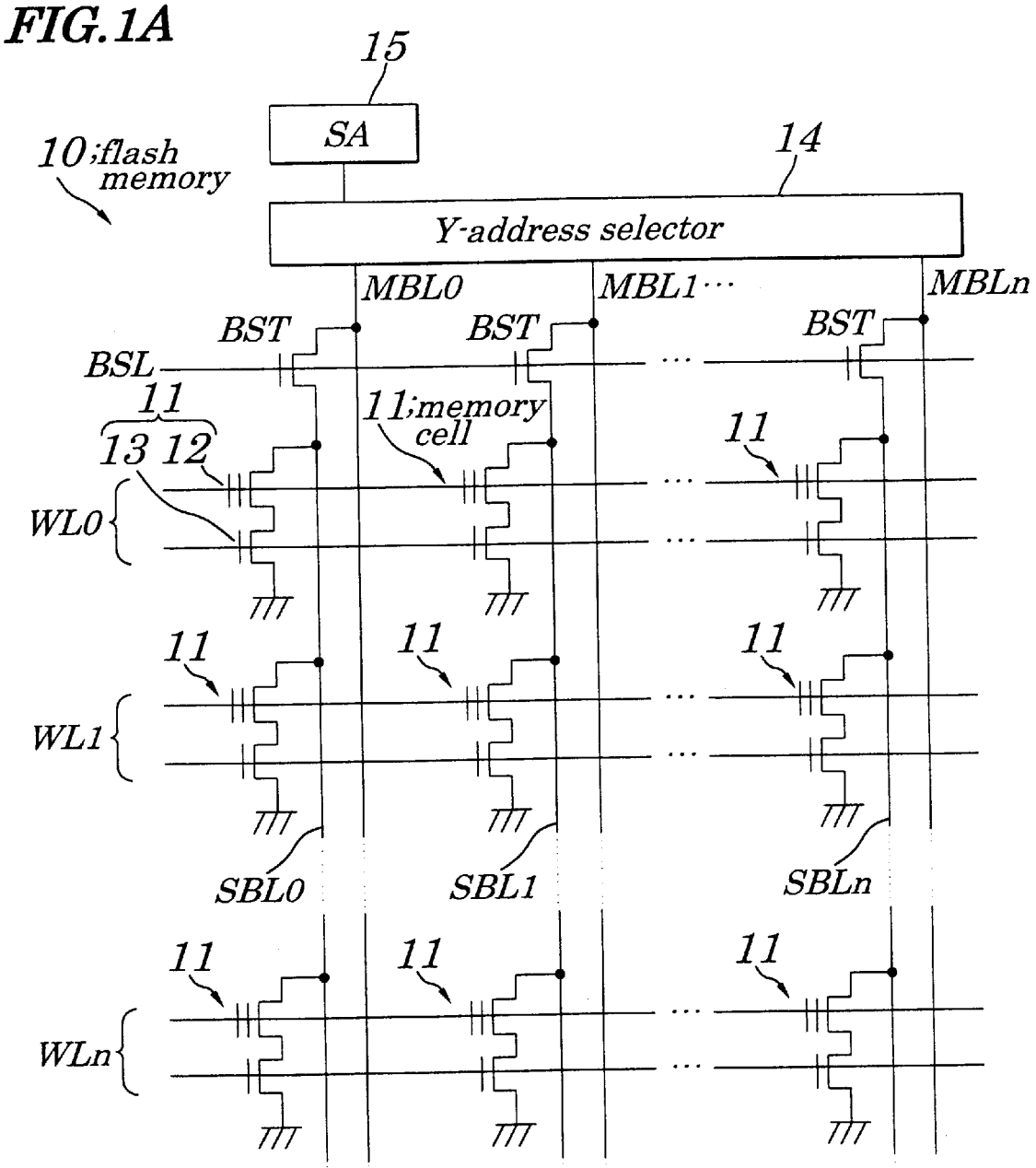
FIG. 1A is an equivalent circuit diagram showing a flash memory according to an embodiment of the present invention.

As shown in FIG. 1A, a flash memory (nonvolatile semiconductor memory device) 10 includes of a word line WLn and a main bit line MBLn, which is in turn connected via a block selecting transistor BST to a sub-bit line SBLn. This type of flash memory 10 is used for example as a logic-mixed flash memory in which a microcomputer is also incorporated).

Each block of the flash memory 10 includes, for example, thirty-two memory cells 11. Each of these memory cells 11 has such a two-transistor construction for high-speed read-out that has a memory transistor 12 and a selecting transistor 13 which are connected in series between a bit line BL and a source electrode so that information may be input, via the bit line BL, to and output from any memory cell 11 selected by a word line $WL_n$. The memory transistor and selecting transistor provide in pair one memory cell 11 for storing one bit of data.

A gate of the memory transistor 12 and that of the selecting transistor 13 are connected with the word line WLn, of which the memory transistor 12 has its drain side D connected to the sub-bit line SBLn and its source side S connected to the selecting transistor 13 (see FIG. 1A).

The main bit line MBLn is connected via a Y-address selector 14 which selects one main bit line MBLn to be read out at a time to a sense-amplifier (SA) 15, so that when, for example, there are provided 1024 main bit lines and 128 sense-amplifiers 15, one of every eight main bit lines $MBL_n$ is selected at a time (see FIG. 1A).

Figure 1B:
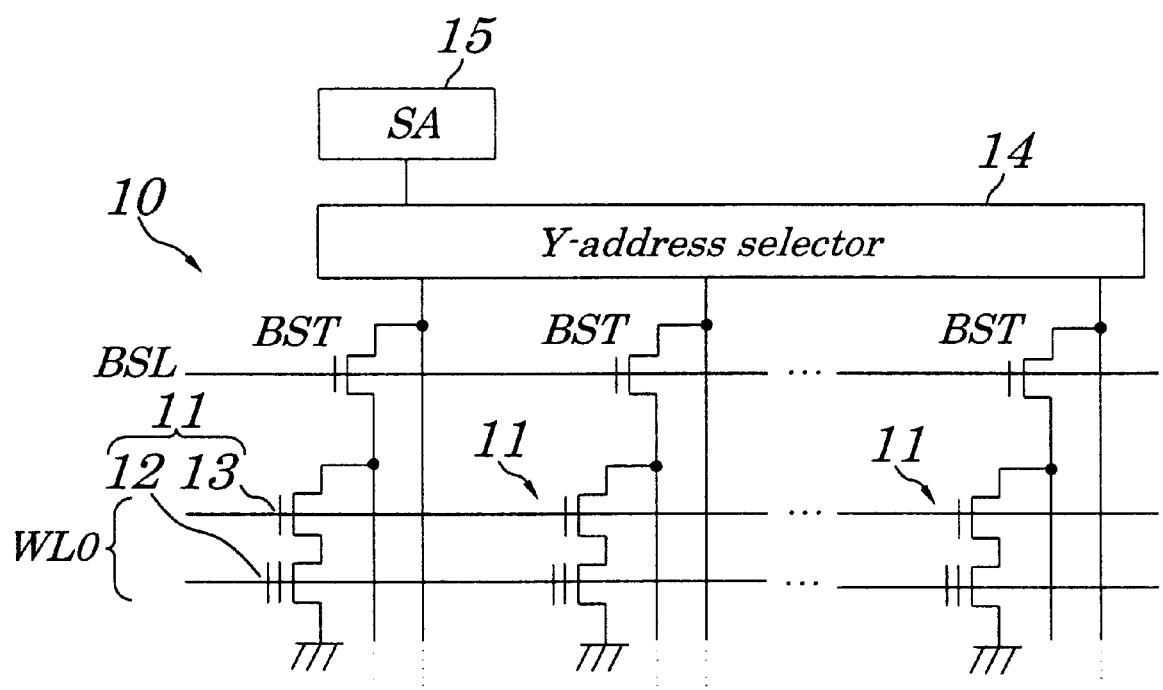
FIG. 1B is an other equivalent circuit diagram showing a flash memory according to the same embodiment.

Alternatively, the flash memory 10 may have its memory transistor 12 and selecting transistor 13 exchanged with each other in position so that the selecting transistor 13 may have its drain side D connected to the sub-bit line SBLn and its source side S connected to the memory transistor 12 (see FIG. 1B).

Figure 2:
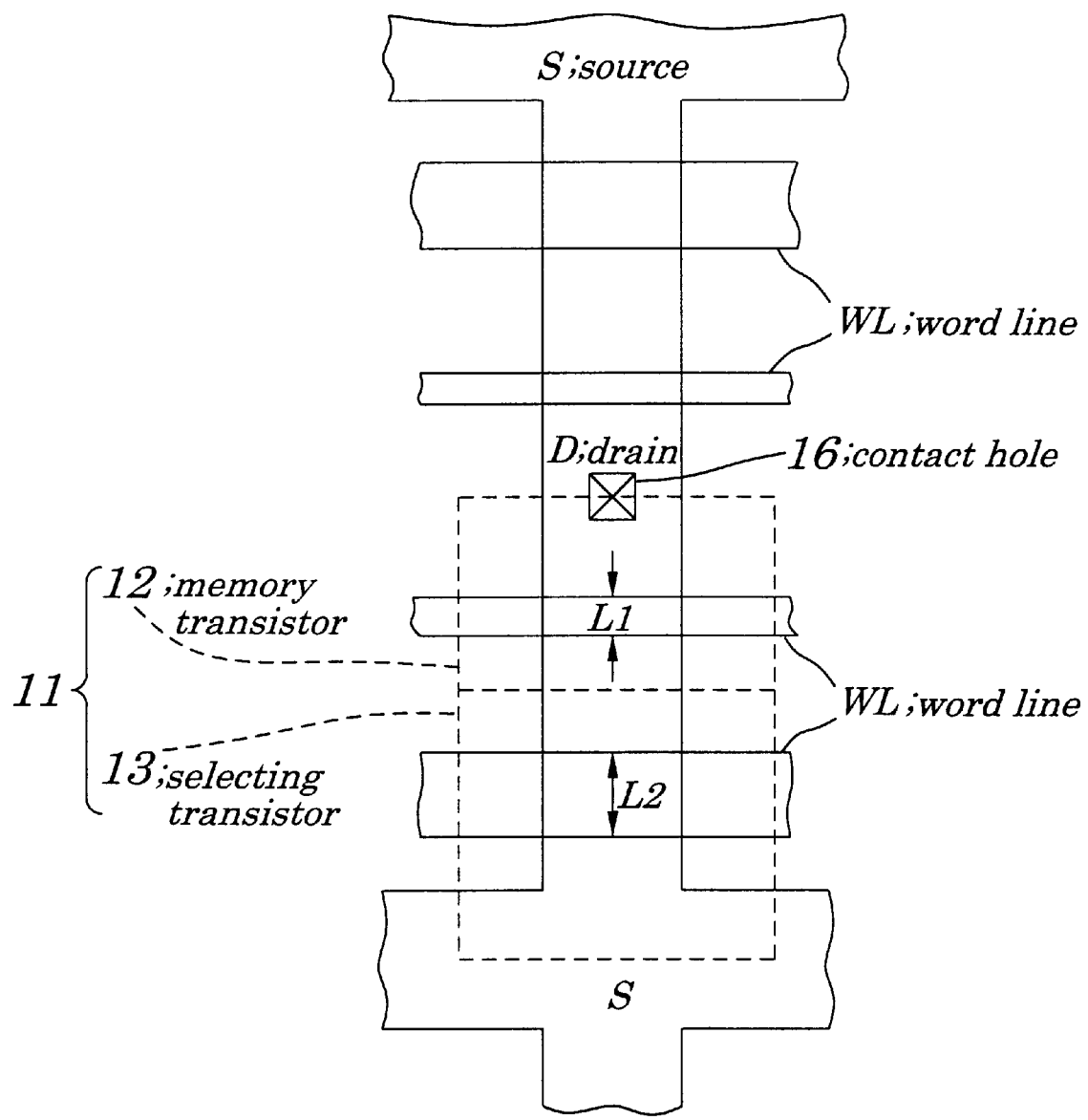
FIG. 2 is an explanatory plan view of an example of a memory cell of FIG. 1A.

As shown in FIG. 2, the memory cell 11 has its memory transistor 12 facing the drain side D, that is each pair of the memory transistors 12 is so arranged as to sandwich a contact hole 16 which is connected to the bit line BL. On an opposite side of the drain D with respect to the memory transistor 12 is arranged the selecting transistor 13. Note here that a dotted line in FIG.2 indicates a region which encloses one memory cell 11.

The memory transistor 12, which faces the drain side D, has its channel length L1 formed shorter than a channel length L2 of the selecting transistor 13, which lies on the source S side (see FIG. 2). Shortening of the channel length L is optimized in each situation, taking into account properties of the flash memory 10, in particular its capacitance ratio, back-gate properties, or a like.

For example, a ratio of channel length L1:L2, as calculated between the channel length L1 of the memory transistor 12 facing the drain D side and the channel length L2 of the selecting transistor 13 facing the source S side, is optimized at about 1:0.25 to 1:0.75. Specifically, for example, if L1=0.36 µm, then L2=0.24 µm.

Figure 3:
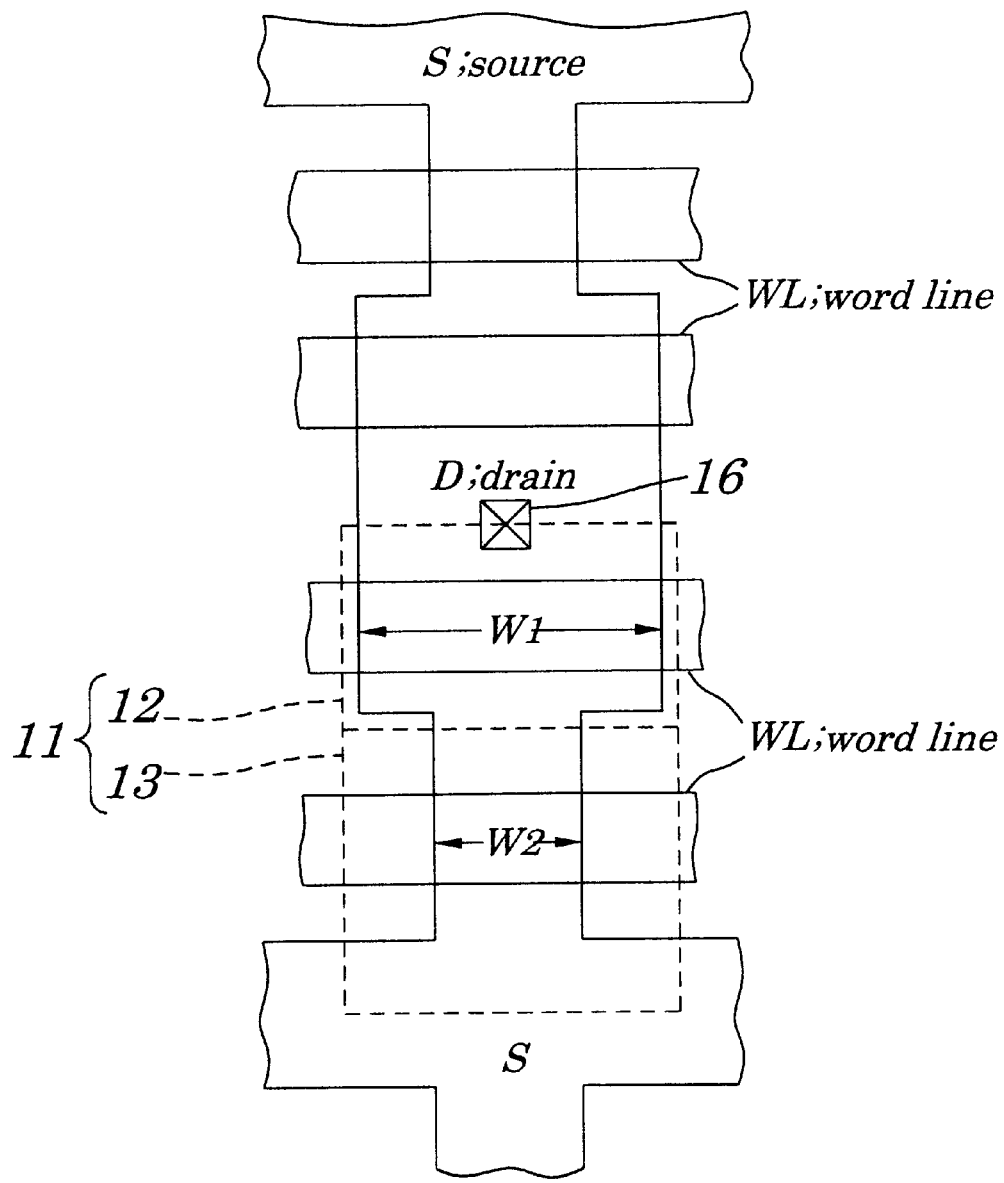
FIG. 3 is an explanatory plan view of another example of the memory cell of FIG. 1A.

As shown in FIG. 3, the memory cell 11 has such a configuration that its memory transistor 12 may face the drain side D, that is each pair of the memory transistors 12 may be positioned so as to sandwich the contact hole 16 connected to the bit line BL. Opposite to the drain D side with respect to the memory transistor 12 is positioned the selecting transistor 13. Note here that a dotted line in FIG. 3 indicates a region which encloses one memory cell 11.

The memory transistor 12, which faces the drain D side, has its channel width W1 larger than a channel width W2 of the selecting transistor 13, which faces the source side S. Enlargement of the channel width W is optimized in each situation, taking into account properties of the flash memory 10, in particular its capacitance ratio, back gate properties, or the like.

For example, a ratio of channel width W1:W2, as calculated between the channel width W1 of the memory transistor 12 facing the drain side D and the channel width W2 of the selecting transistor 13 facing the source side S is optimized at about 1:1.2 to 1:2.0. Specifically, if W1=0.40 µm, then W2=0.50 µm.

In this case, for example, the transistors adjacent to each other may be reversed in their drain-source mating relationship, to be combined as shifted at a protrusion, thus preventing the memory cell 11 from becoming larger.

The following will describe the channel length L and the channel width W. This description is made with reference to the memory transistor 12 but applicable also to the selecting transistor 13.

Figure 4A:
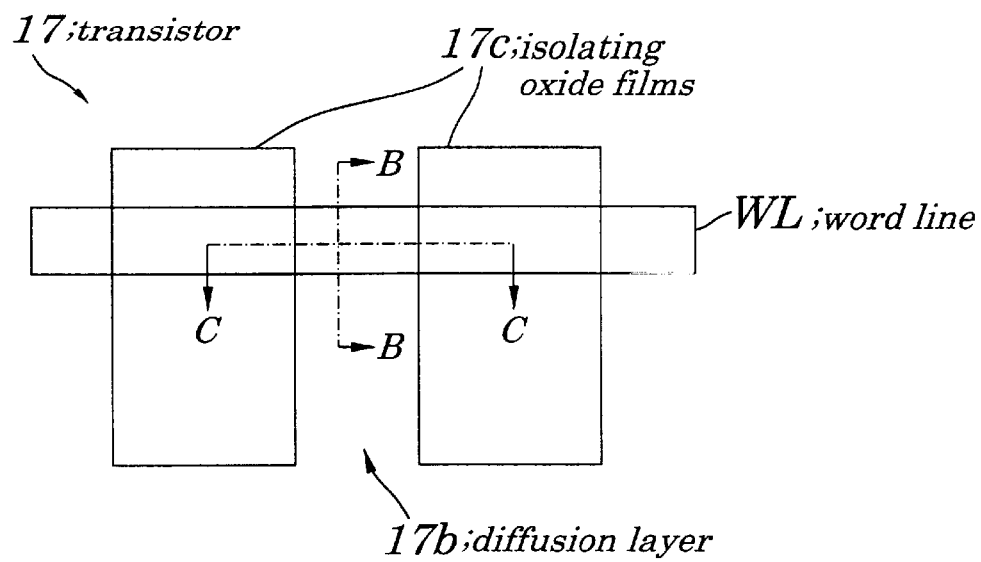
FIG. 4A is a plan view of a transistor for explaining its channel length and channel width.
Figure 4B:
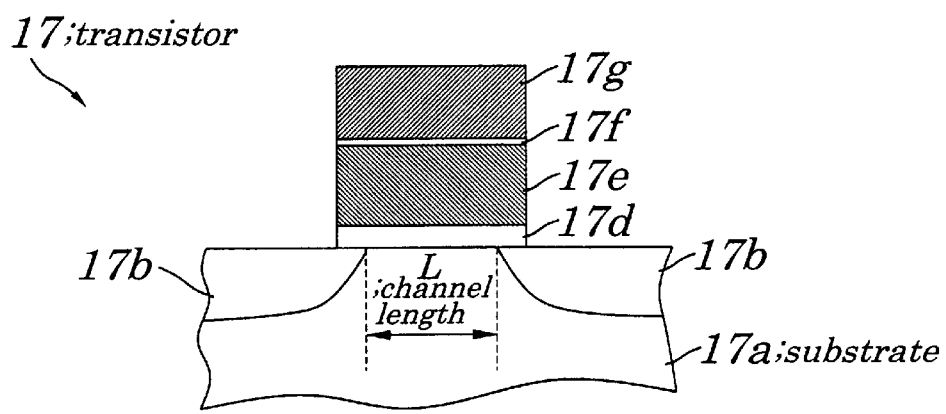
FIG. 4B is a cross-sectional view taken along line B—B of FIG. 4A, in a direction parallel to an extension of an isolating oxide film.
Figure 4C:
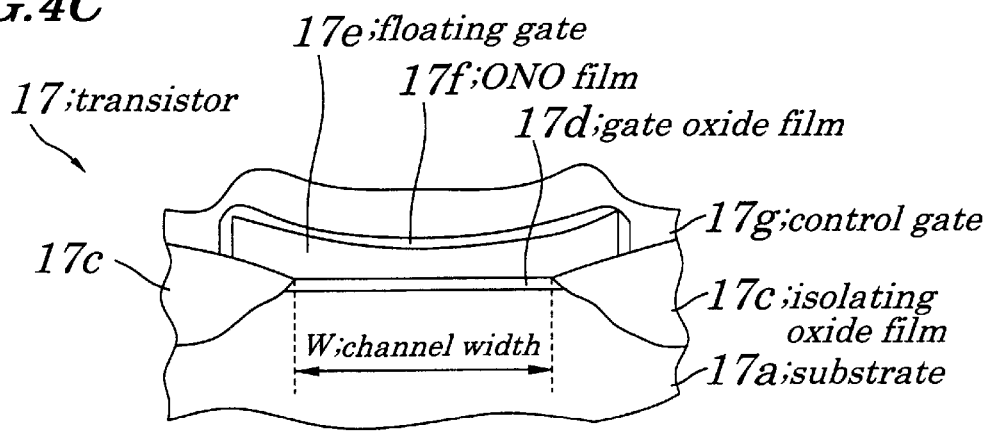
FIG. 4C is a cross-sectional view taken along line C—C of FIG. 4A, in direction parallel to a word line.

As shown in FIGS. 4A, 4B and 4C, in a transistor 17, on both sides of a diffusion layer 17b formed in a substrate 17a are formed isolating oxide films 17c (see FIG. 4A), between which are stacked a gate oxide film 17d, a floating gate 17e, an ONO (Oxide Nitride Oxide) film 17f, and a control gate (word line WL) 17g in this order (see FIGS. 4B and 4C).

In this transistor 17, a channel refers to an inversion layer which is formed directly below the gate oxide film 17d when an appropriate voltage is applied to the gate electrode (not shown). Channel length L, therefore, is defined as a distance (L) between the diffusion layers 17b directly below the gate electrode (not shown) (see FIG. 4B), while channel width W is defined as a distance (W) between the isolating oxide films 17c directly below the gate electrode (not shown) (see FIG. 4C).

Although in the above description, the channel length L has been made larger with the memory transistor 12 than with the selecting transistor 13 or the channel width W has been made larger with the memory transistor 12 than with the selecting transistor 13, variations in size for the channel length and the channel width are not limited to them.

That is, the memory transistor 12 or the selecting transistor 13 whichever faces the drain side D has a shorter channel length L or a larger channel width W than the other transistor which faces the source side S.

Figure 5:
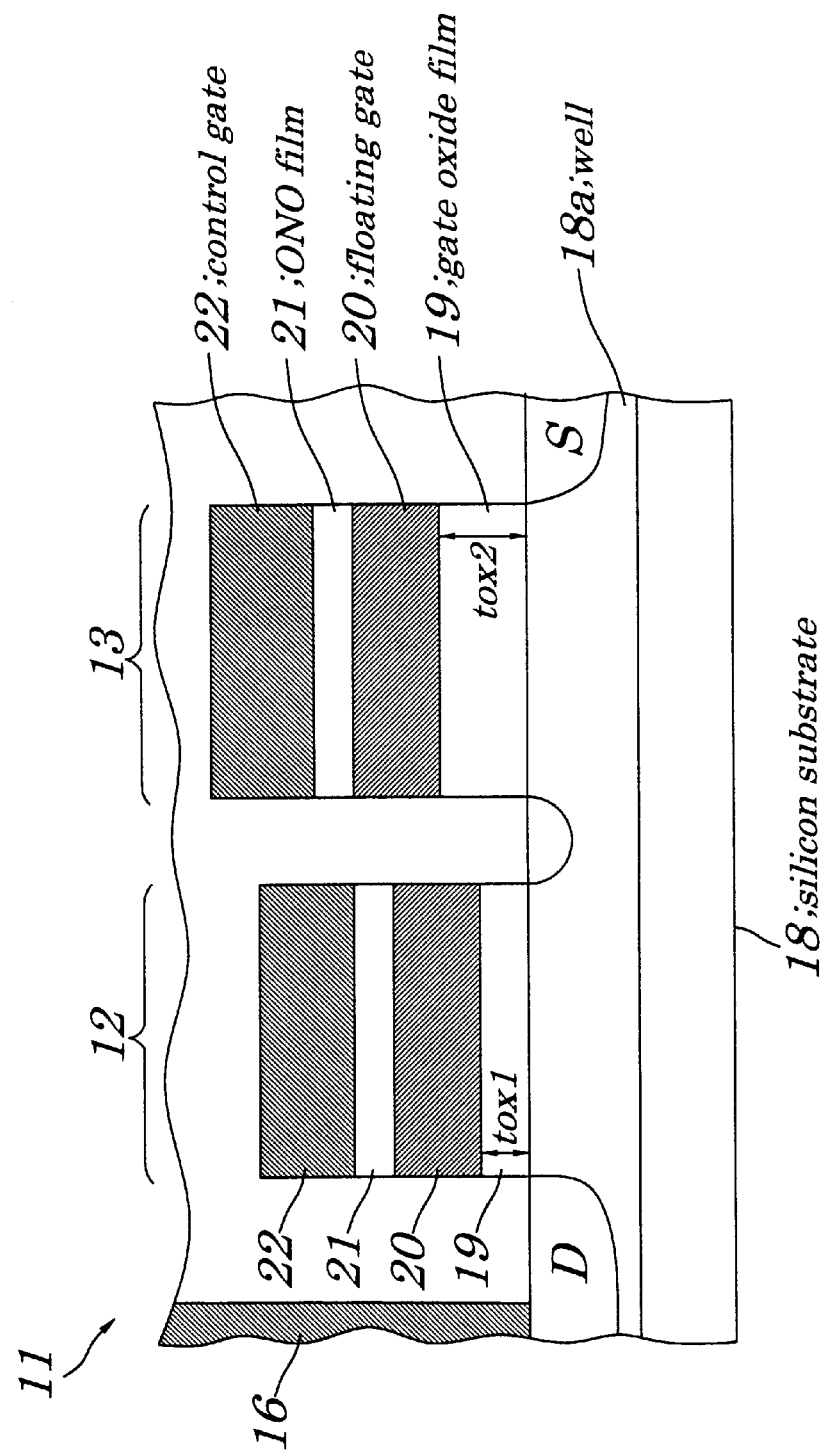
FIG. 5 is a cross-sectional view showing still another example of the memory cell of FIG. 1A.

As shown in FIG. 5, the memory transistor 12 and the selecting transistor 13 which form one memory cell 11 (see the dotted lines in FIGS. 2 and 3) are formed side by side on a silicon substrate 18 with the memory transistor 12 facing the contact hole 16.

In a well 18a within the silicon substrate 18 are provided the source region S to be grounded and the drain region D to be connected to the bit line, between which are formed two channels.

The memory transistor 12 and the selecting transistor 13 each have a gate oxide film (tunnel oxide film) 19, a floating gate 20, an ONO film 21, and a control gate 22 stacked on the silicon substrate 18 in this order. The floating gate 20 and the control gate 22 of the selecting transistor 13 are short-circuited with each other at a predetermined portion not shown.

In this memory cell 11, a film thickness tox1 of the gate oxide film 19 of the memory transistor 12 facing the drain side D is formed smaller than a film thickness tox2 of the gate oxide film 19 of the selecting transistor 13 facing the source side S.

Thinning of this gate oxide film 19 is optimized in each situation, taking into account properties of flash memory 10, in particular its capacitance ratio, back gate properties, or alike.

For example, a ratio of film thickness tox2:tox1, as calculated between the film thickness tox1 of the gate oxide film 19 facing the drain side D and the film thickness tox2 of the gate oxide film facing the source side S, is optimized at from 1:0.5 to 1:0.95. Specifically, for example, if tox2=10 nm, then tox1=8 nm.

As shown in FIGS. 6A to 6F, on the silicon substrate 18, the gate oxide film 19 is stacked as thick as a film thickness of about up to 6 nm (nearly 6 nm).

On this silicon substrate 18, a photo-resist 23 is applied corresponding to a transistor forming region Da in the drain side D using a photolithography process, for patterning to form a resist pattern (see FIG. 6A).

After the resist pattern is formed, wet etching is performed to reduce the photo-resist 23. With this, the gate oxide film 19 is left only in a transistor forming region Sa on the source side S of the silicon substrate 18 (see FIG. 6B).

Next, on the silicon substrate 18, gate oxide film (tunnel oxide film) is further stacked to a film thickness of about 8 nm (nearly 8 nm). As a result, a first gate oxide film (tunnel oxide film) 19a is formed in the drain D side transistor forming region Da and a second gate oxide film (tunnel oxide film) 19b, in the source S side transistor forming region Sa (see FIG. 6C).

With this, the first gate oxide film 19a has the film thickness tox1 of about 8 nm, while the second gate oxide film 19b has the film thickness tox2 of about 10 nm.

Next, on both the first gate oxide film 19a and second gate oxide film 19b, using for example a CVD (Chemical Vapor Deposition) method, a polycrystalline-silicon made floating gate 20 is deposited to a thickness of about 150 nm and then phosphorus (P) ions are implanted at a density of $5 \times 10^{14}$/cm$^2$ with acceleration energy of 40 keV.

Next, gate etching is performed to form the floating gate 20 and then remove the photo-resist. After removal, on the polycrystalline-silicon made floating gate 20, the ONO film 21 is deposited to a thickness of about 17 nm, calculated as an oxide film (see FIG. 6D).

Next, a polycrystalline-silicon made control gate 22 is deposited to a thickness of about 150 nm and then phosphorus (P) is diffused to provide a resistivity of about 40 Ω/□, following which a tungsten silicide (WSi) 24 is deposited to a thickness of about 150 nm by sputtering (see FIG. 6E).

On thus deposited WSi 24 is formed a pattern by use of a photo-resist 25, which pattern is then used as a protection mask to perform gate etching, thus forming the control gate 22 (see FIG. 6F).

By etching, on the silicon substrate 18 are stacked the first gate oxide film 19a and second gate oxide film 19b, the polycrystalline-silicon floating gate 20, the ONO film 21, the polycrystalline-silicon control gate 22, the WSi 24, and the photo-resist 25 in this order, to form the memory transistor 12 and the selecting transistor 13 side by side (see FIG. 6F).

With this, such a memory cell 11 can be formed that the film thickness tox1 of the gate oxide film 19a of the transistor facing the drain side D, that is, the memory transistor 12 is smaller than the film thickness tox2 of the gate oxide film 19b of the transistor facing the source side S, that is, the selecting transistor 13. Then, the source S and the drain D are formed.

As shown in FIGS. 7A to 7F, on the silicon substrate 18 with a through hole 26 formed therein (see FIG. 7A), a photo-resist 27 is applied corresponding to the drain D side transistor forming region Da, to form a resist pattern by patterning.

Figure 7A:
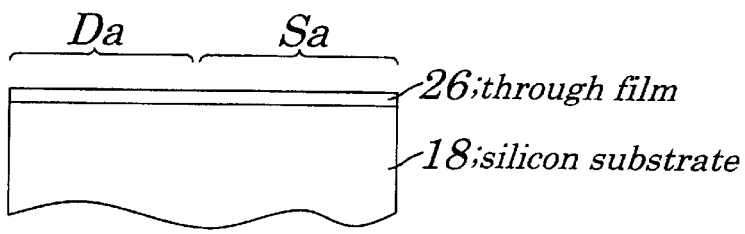
FIGS. 7A through 7F are flow diagrams showing respectively other processes of manufacturing the memory cell.
Figure 7B:
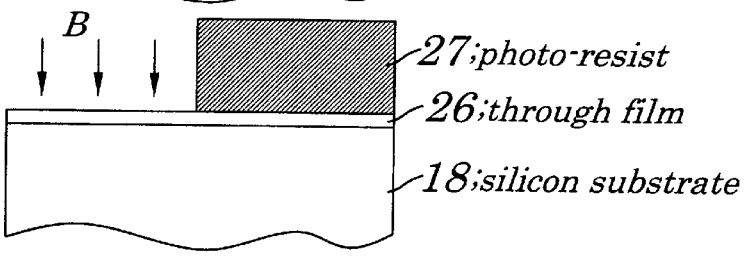
Figure 7C:
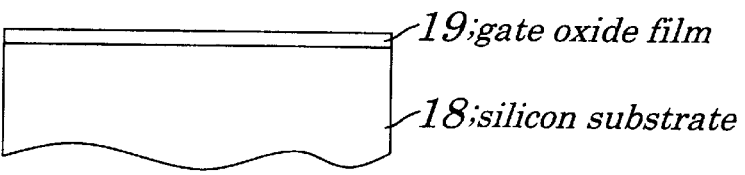
Figure 7D:
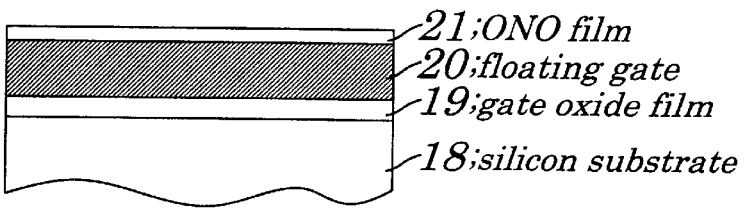

Next, using this pattern as a protection mask, boron (B) ions are implanted at a density of $2 \times 10^{12}$/cm$^2$ with acceleration energy of 30 keV (see FIG. 7B). Then, the photo-resist 27 is removed and, subsequently, the through film 26 is removed.

With this ion implantation, it is possible to give differences in threshold voltage between the drain side D transistor forming region Da in which the ions are implanted and the source side S transistor forming region Sa in which the ions are not implanted.

Next, the surface of silicon substrate 18 is wet-oxidized at 850° C. (see FIG. 7C), and on thus obtained gate oxide film 19 is deposited, for example, the polycrystalline-silicon floating gate 20 to a thickness of about 150 nm, following which phosphorus (P) ions are implanted at a density of $5 \times 10^{14}/cm^2$ with acceleration energy of 40 keV. The subsequent processes are same as those for manufacturing the memory cell 11 shown in FIG. 6.

Next, gate etching is performed to form the floating gate 20 and subsequently remove the photo-resist. After the removal, on the polycrystalline-silicon floating gate 20 is deposited the ONO film 21 to a thickness of about 17 nm, calculated as an oxide film (see FIG. 7D).

Figure 7E:
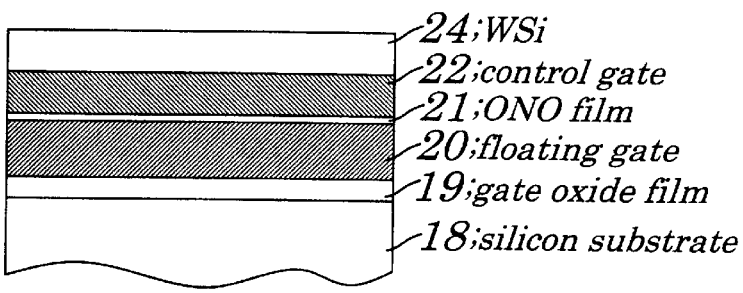

Next, the polycrystalline-silicon control gate 22 is deposited to a thickness of about 150 nm and then, phosphorus (P) is diffused to provide a resistivity of about 40 Ω/□, following which, tungsten silicide (WSi) 24 is deposited to a thickness of about 150 nm by sputtering (see FIG. 7E).

Next, on thus deposited WSi 24 is formed a pattern by use of the photo-resist 25, which pattern is used as a protection mask to form the control gate 22 by gate etching.

Figure 7F:
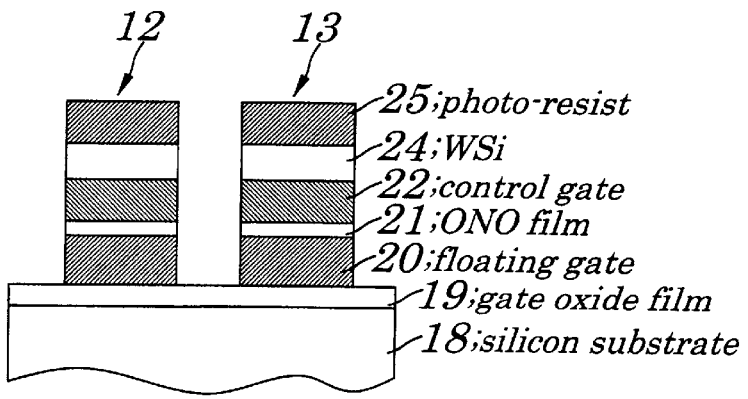

By this etching, on the silicon substrate 18 are stacked the gate oxide film 19, the polycrystalline-silicon floating gate 20, the ONO film 21, the polycrystalline-silicon control gate 22, the WSi 24, and the photo-resist 25 in this order, to form the memory transistor 12 and the selecting transistor 13 side by side (see FIG. 7F). Then, the source S and the drain D are formed.

With this, it is possible to suppress a shift in the threshold voltage of the drain D side transistor in which the ions are implanted, that is, the memory transistor 12 as compared to that of the source S side transistor in which no ions are implanted, that is, the selecting transistor 13.

That is, since the substrate bias depends on an impurity concentration and no current flows if a shift is suppressed in the threshold voltage of the transistor, the substrate-bias effect can be inhibited by implanting boron (B) ions only to the drain D side to thus suppress the shift in the threshold voltage of the transistor.

Thus, the memory transistor 12 or the selecting transistor 13 whichever faces the drain D side has a shorter channel length L or a larger channel width W than the other transistor which faces the source side S and also the film thickness of the gate oxide film 19 tox is reduced. As a result, the turn-on current (driving force) of the drain D side transistor of the memory cell 11 having the two-transistor construction is increased.

Figure 8:
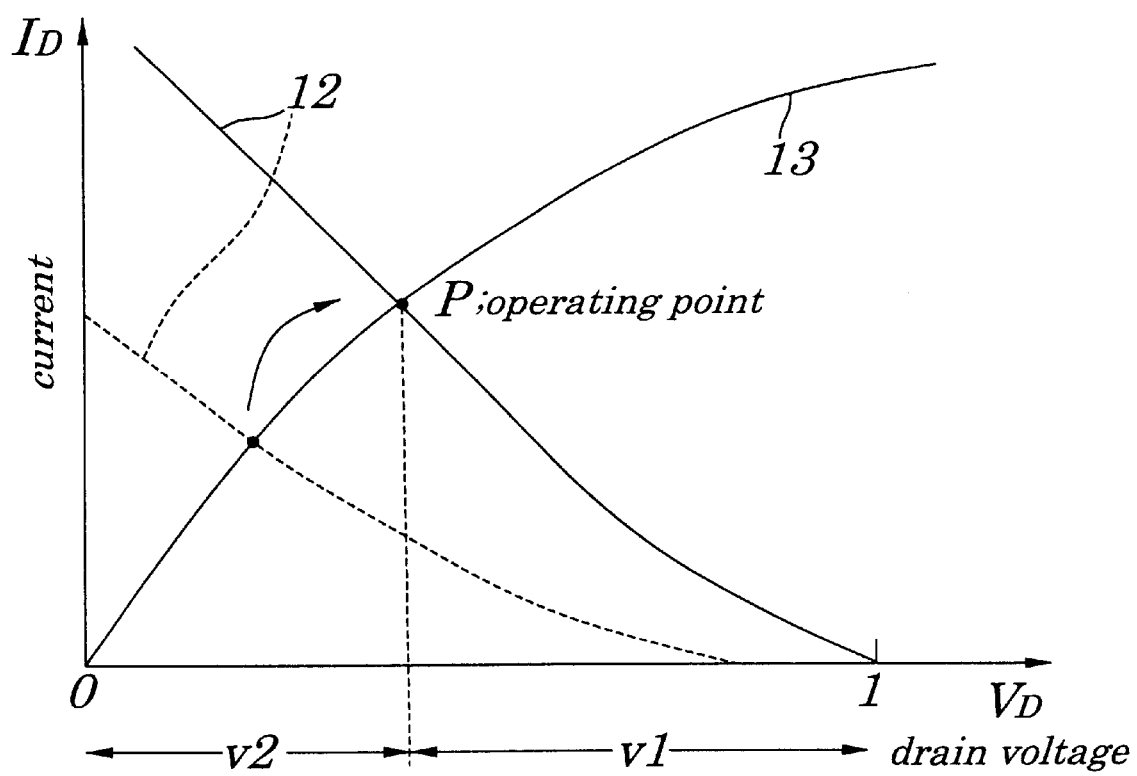
FIG. 8 is a graph showing in a load curve the relationship between a voltage applied to the memory cell and its read-out current.
Figure 9:
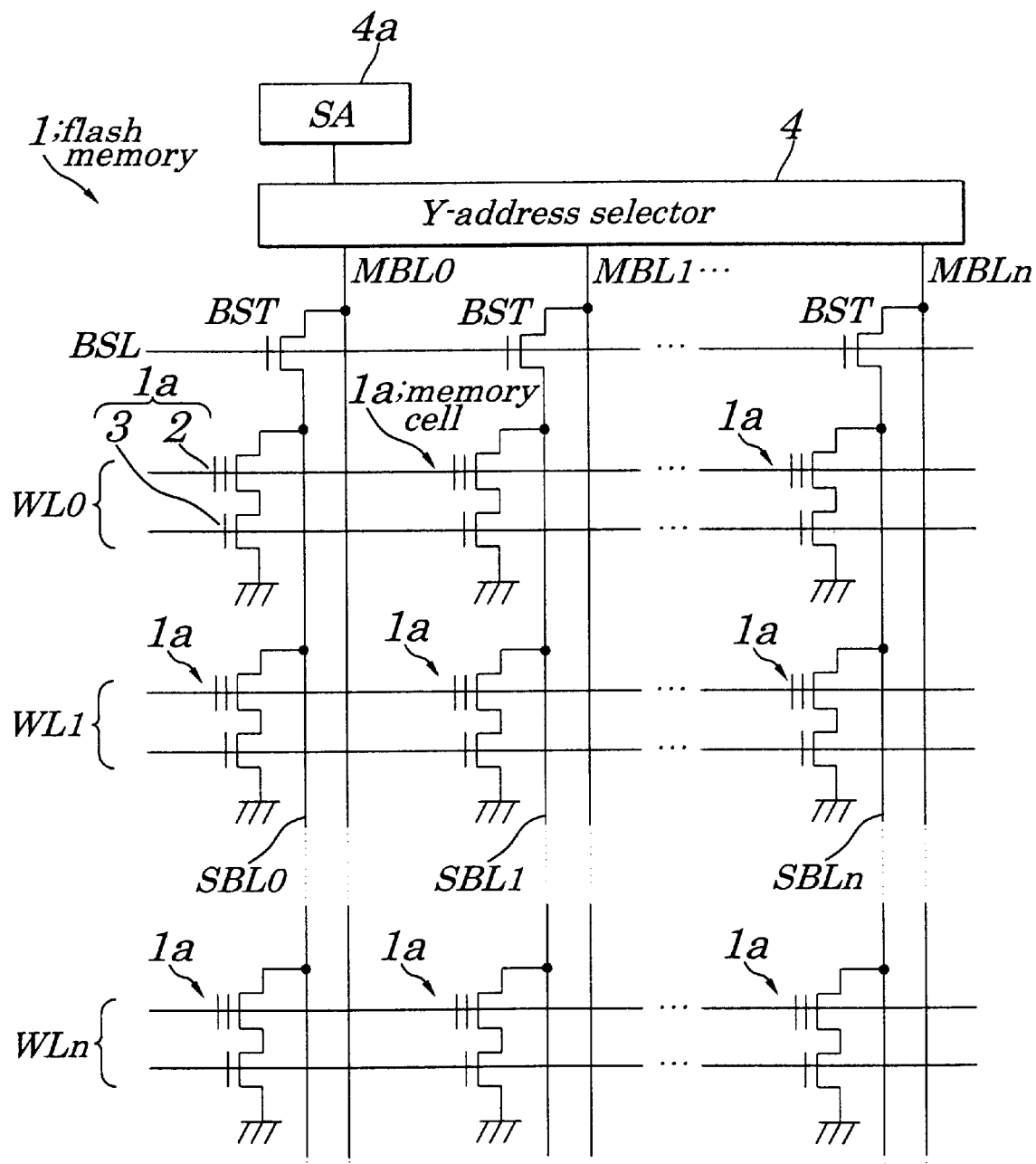
FIG. 9 is an equivalent circuit diagram for showing a conventional flash memory.
Figure 10:
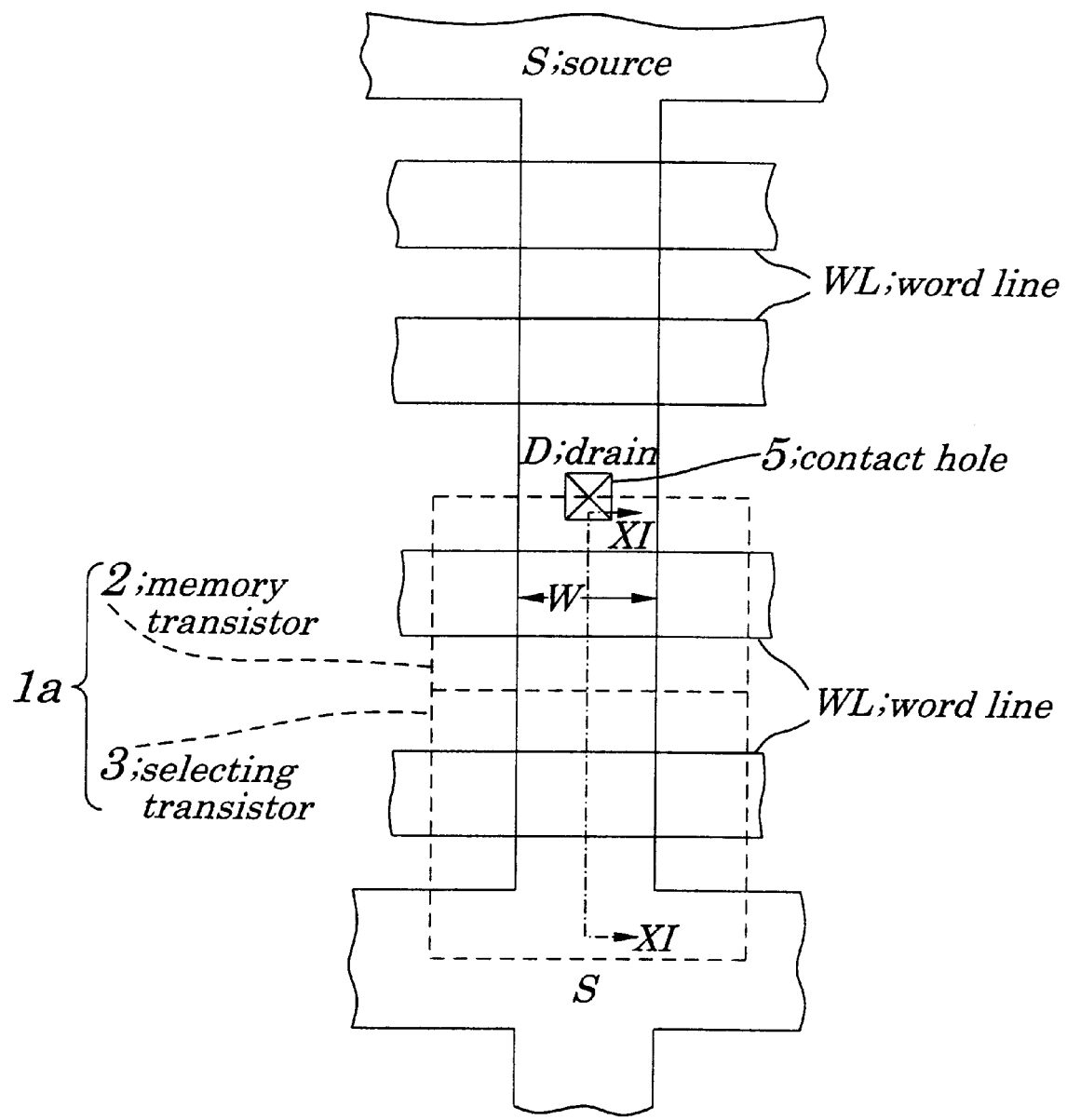
FIG. 10 is an explanatory plan view of a conventional memory cell of FIG. 9.
Figure 11:
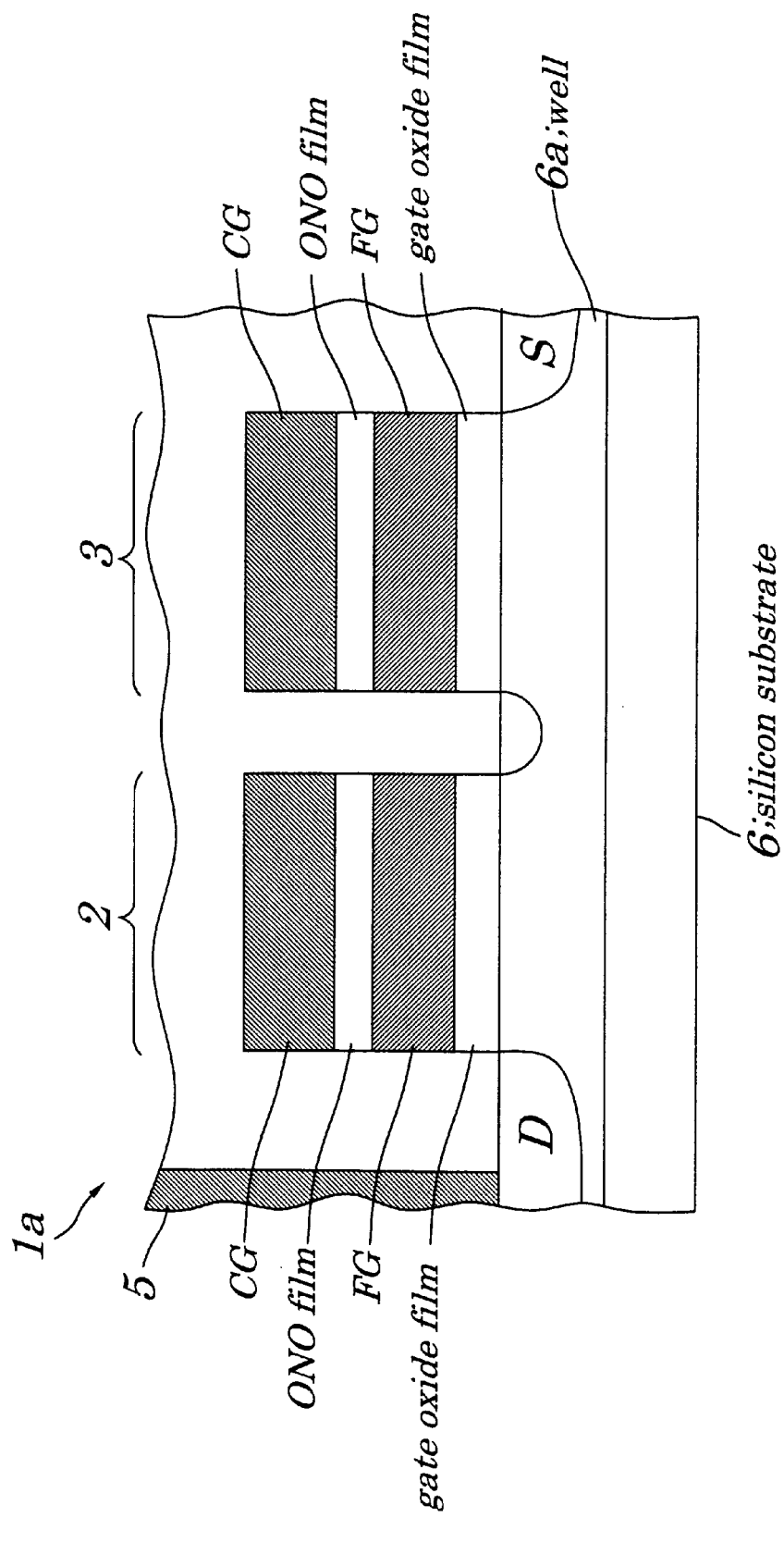
FIG. 11 is a cross-sectional view taken along line XI—XI of FIG. 10.
Figure 12C:
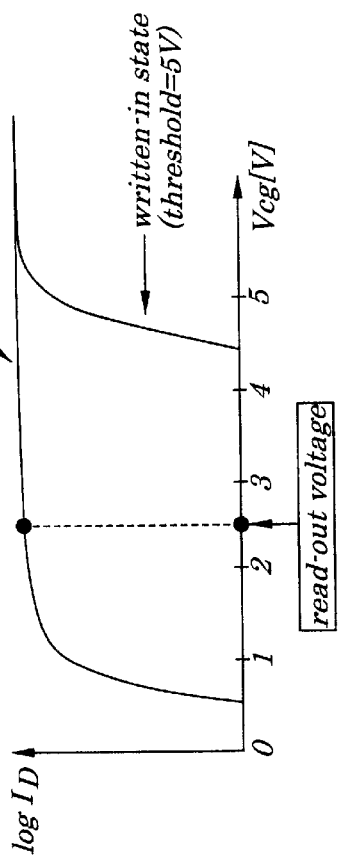
FIG. 12C is an explanatory graph for showing read-out operations of the conventional flash memory.
Figure 12B:
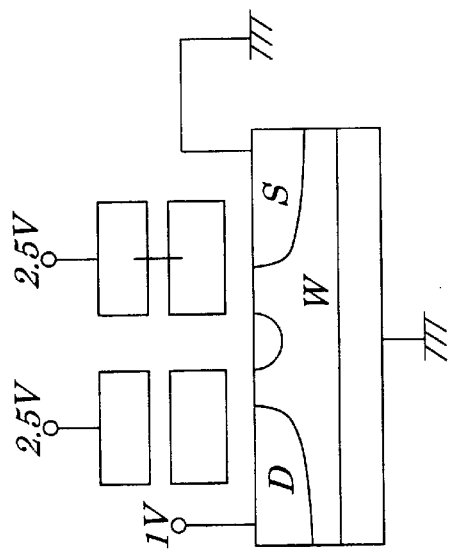
FIG. 12B is a cross-sectional view of the conventional memory cell structure.
Figure 12A:
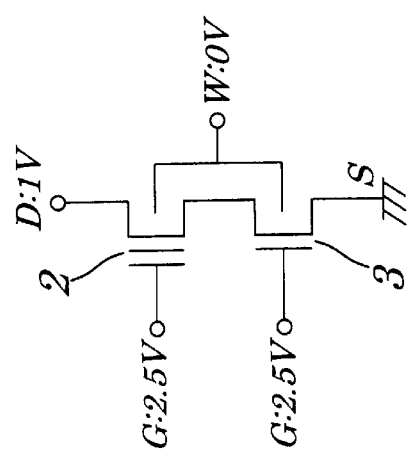
FIG. 12A is an equivalent circuit diagram of the conventional memory cell showing read-out operations of the conventional flash memory.
Figure 13:
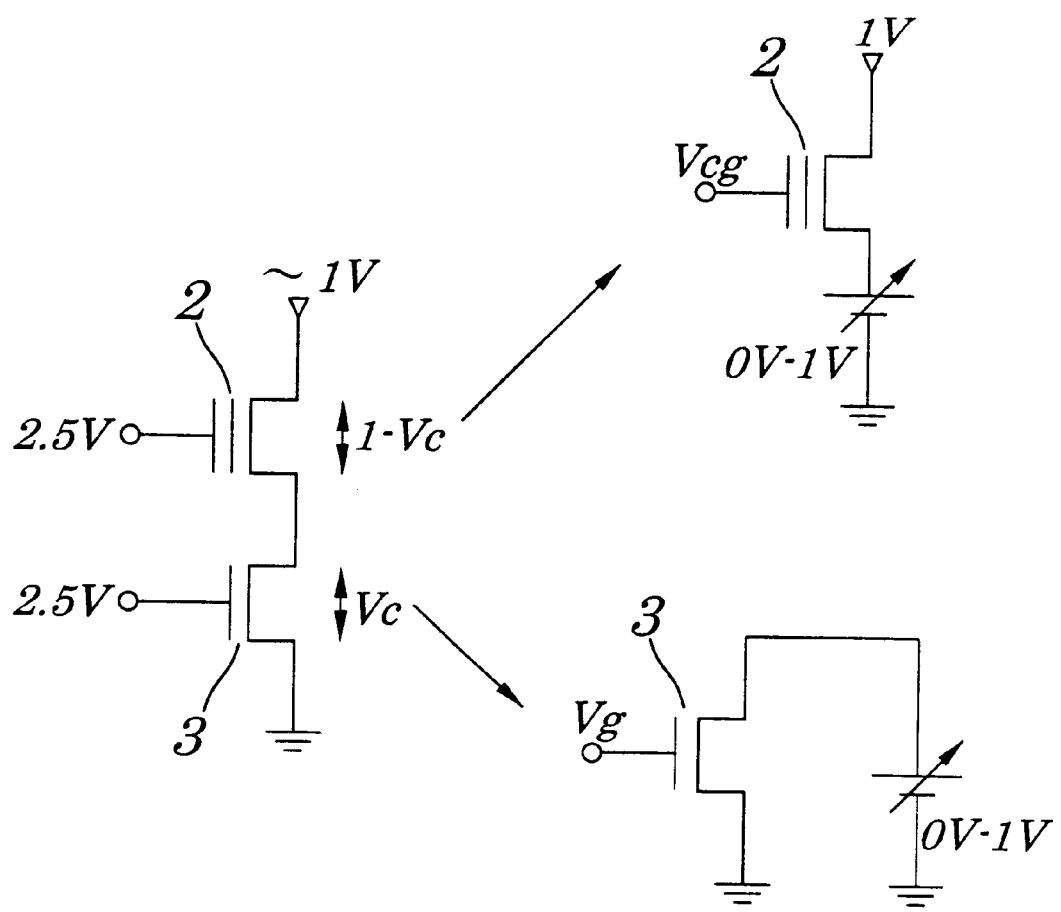
FIG. 13 shows a relationship between two transistors of the conventional art in terms of read-out voltage, in detail showing voltage distribution and a state where these two transistors are separated from each other.
Figure 14:
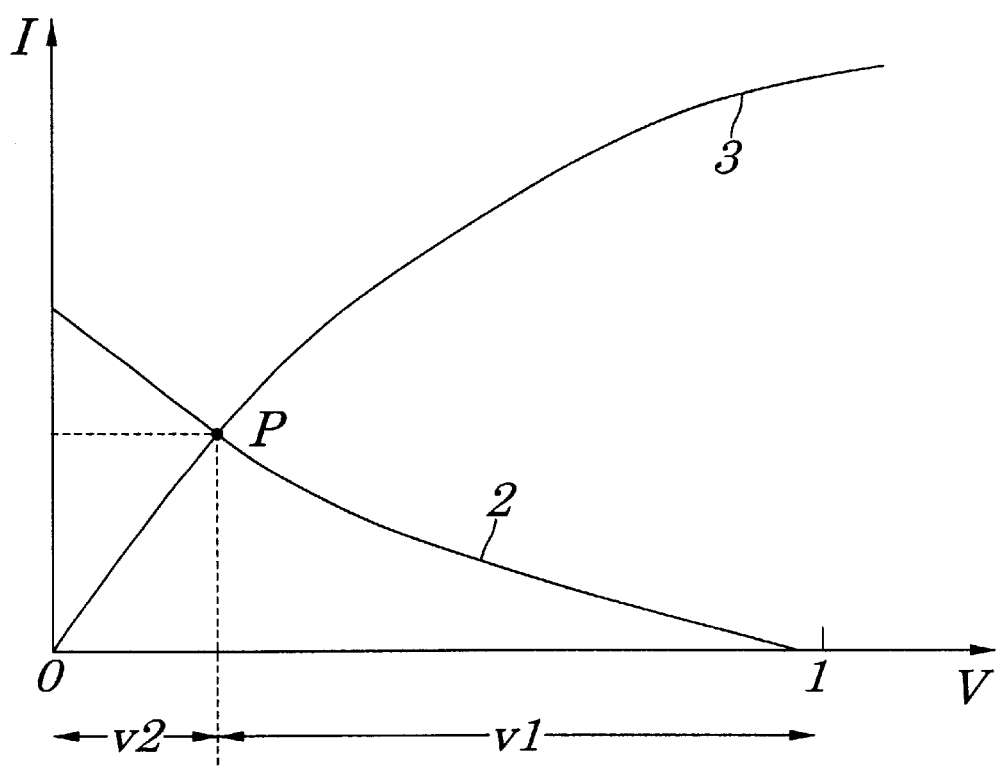
FIG. 14 is a graph showing in a load curve a relationship between voltage applied to the conventional memory cell and its read-out current.
Figure 15A:
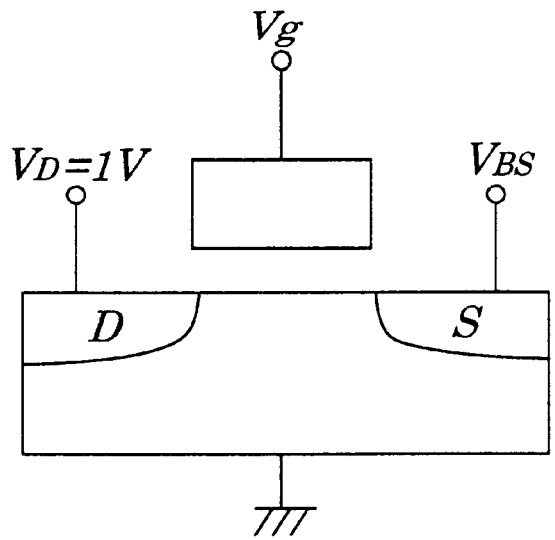
FIG. 15A shows a relationship between the conventional transistor's driving force and a substrate-bias effect, in detail showing voltage application onto the conventional transistor.
Figure 15B:
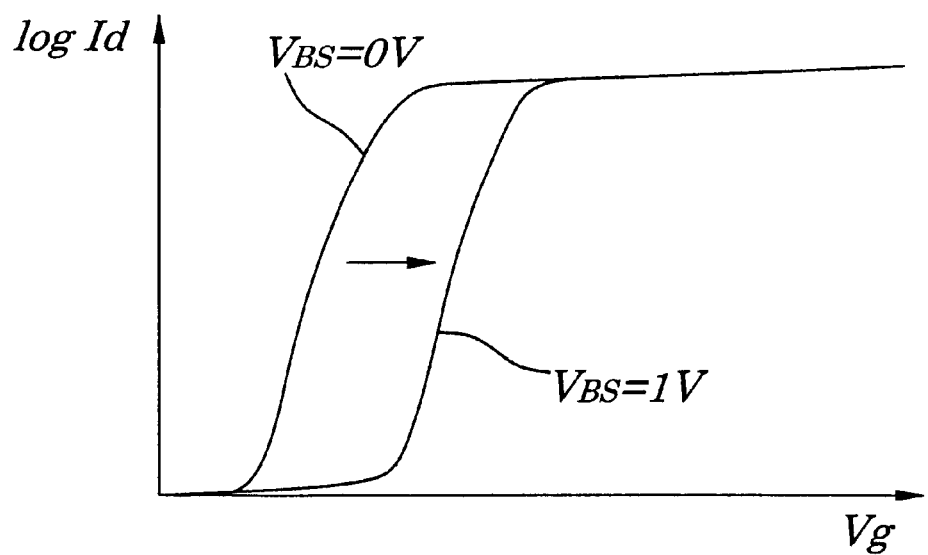
FIG. 15B shows a relationship between the conventional transistor's driving force and a substrate-bias effect, in detail showing a change in threshold voltage.

As shown in FIG. 8, the turn-on current (driving force) of the memory cell 11 having the two-transistor construction can be obtained from a load curve which represents a relationship between voltage applied to the memory cell 11 and a resultant read-out current, with which therefore, by raising the driving force of the drain D side transistor, balance can be improved between the voltages applied to the two transistors and also the turn-on current for the memory cell 11 can be increased.

That is, the operating point P for the memory cell 11, which is an intersection of the load curves of the memory transistor 12 and the selecting transistor 13, moves right upward, to apply voltages v1 and v2 to the memory transistor 12 and the selecting transistor 13 respectively, thus flowing a read-out current (turn-on current) $I_d$ which corresponds to this operating point.

This results in enhancement of the driving force of the memory transistor 12 or the selecting transistor 13 whichever faces the drain side D, thus increasing the drain current $I_d$. This driving force is used to operate next stage transistors, in the case of this flash memory 10, transistors of the sense-amplifier 15.

The right upward movement of the operating point P also decreases a difference of the voltages applied to the memory transistor 12 and the selecting transistor 13, thus equalizing loads on these two transistors.

Thus, with the configuration of the embodiment of the present invention, it is possible to raise the driving force of the drain D side transistor, to thus provide a larger rise-tolerant range and equalize voltages applied to the two transistors, thus equalizing their loads.

With this, the driving force, that is, read-out current can be increased, to increase the read-out speed, a most important property for the logic-mixed flash memories.

Note here that although in the above-mentioned embodiments the memory transistor 12 or the selecting transistor 13 whichever faces the drain side D have had a shorter channel length L or a larger channel width W than the other transistor facing the source side S and also the gate oxide film 19 have had a smaller film thickness tox, these settings may be effected alone or in combination.

That is, it may be possible that the transistor facing the drain side D has a shorter channel length L and a larger channel width W than the transistor facing the source side S, or that the former transistor has a shorter channel length L and a smaller film thickness tox of gate oxide film 19, or that the former transistor has a larger channel width W and a smaller film thickness tox of gate oxide film 19, or the former transistor has a shorter channel length L, a larger channel width W, and a smaller film thickness tox of gate oxide film 19.

In contrast to the above-mentioned configuration and manufacturing process of the memory cell 11 using N-channel transistors, in the case of the memory call 11 using P-channel transistors, in place of the silicon substrate in which the P-well is formed, a silicon substrate in which an N-well is formed is used to implant phosphorus (P) ions at a density of $2 \times 10^{12}/cm^2$ with accelerating energy of 40 keV for adjusting the threshold voltage in place of implanting boron (B) ions at a density of $2 \times 10^{12}/cm^2$ with accelerating energy of 30 keV for threshold adjustment.

It is thus apparent that the present invention is not limited to the above embodiments but may be changed and modified without departing from the scope and spirit of the invention.

Finally, the present application claims the priority of Japanese Patent Application No. Hei11-201270 filed on Jul. 15, 1999, which is herein incorporated by reference.

What is claimed is:

1. A nonvolatile semiconductor memory device comprising a plurality of memory cells connected in parallel with each other each of which has a memory transistor and a selecting transistor connected in series between a bit line and a source electrode, in such a configuration that information can be, via said bit line, input to and output from any one of said memory cells which is selected by a word line connected to gate electrodes of said memory transistor and said selecting transistor, wherein driving force of said memory transistor or said selecting transistor whichever faces said bit line is enhanced, and wherein at least one pair of said plurality of memory cells include a pair of said memory transistors or said selecting transistors sandwiching said bit line.

2. The nonvolatile semiconductor memory device according to claim 1, wherein said memory transistor/said selecting transistor which faces said bit line lies on a drain side of any one of said memory cells.

3. A nonvolatile semiconductor memory device comprising a plurality of memory cells connected in parallel with each other each of which has a memory transistor and a selecting transistor connected in series between a bit line and a source electrode, in such a configuration that information can be, via said bit line, input to and output from any one of said memory cells which is selected by a word line connected to gate electrodes of said memory transistor and said selecting transistor, wherein driving force of said memory transistor or said selecting transistor whichever faces said bit line is enhanced, wherein said memory transistor/said selecting transistor which faces said bit line lies on a drain side of any one of said memory cells, and wherein said memory transistor/said selecting transistor which lies on said drain side has a shorter channel length than said selecting transistor/said memory transistor which faces a source side in each of said memory cells.

4. The nonvolatile semiconductor memory device according to claim 3, wherein a ratio in channel length of said selecting transistor/said memory transistor which faces said source side and said memory transistor/said selecting transistor which lies on said drain side is from about 1:0.25 to 1:0.75.

5. The nonvolatile semiconductor device according to claim 3, wherein said memory transistor/said selecting transistor which lies on said drain side has a larger channel width than said selecting transistor/said memory transistor which faces said source side.

6. The nonvolatile semiconductor memory device according to claim 5, wherein a ratio in channel width of said selecting transistor/said memory transistor which faces said source side and said memory transistor/said selecting transistor which lies on said drain side is from about 1:1.2 to 1:2.0.

7. The nonvolatile semiconductor device according to claim 3, wherein a gate oxide film of said memory transistor/said selecting transistor which lies on said drain side is smaller than a gate oxide film of said selecting transistor/said memory transistor which faces said source side.

8. The nonvolatile semiconductor memory device according to claim 7, wherein a ratio in gate oxide film thickness of said selecting transistor/said memory transistor which faces said source side and said memory transistor/said selecting transistor which lies on said drain side is from about 1:0.5 to 1:0.95.

9. A nonvolatile semiconductor memory device comprising a plurality of memory cells connected in parallel with each other each of which has a memory transistor and a selecting transistor connected in series between a bit line and a source electrode, in such a configuration that information can be, via said bit line, input to and output from any one of said memory cells which is selected by a word line connected to gate electrodes of said memory transistor and said selecting transistor, wherein driving force of said memory transistor or said selecting transistor whichever faces said bit line is enhanced, wherein said memory transistor/said selecting transistor which faces said bit line lies on a drain side of any one of said memory cells, and wherein said memory transistor/said selecting transistor which lies on said drain side has a larger channel width than said selecting transistor/said memory transistor which faces a source side in each of said memory cells.

10. The nonvolatile semiconductor memory device according to claim 9, wherein a ratio in channel width of said selecting transistor/said memory transistor which faces said source side and said memory transistor/said selecting transistor which lies on said drain side is from about 1:1.2 to 1:2.0.

11. A nonvolatile semiconductor memory device comprising a plurality of memory cells connected in parallel with each other each of which has a memory transistor and a selecting transistor connected in series between a bit line and a source electrode, in such a configuration that information can be, via said bit line, input to and output from any one of said memory cells which is selected by a word line connected to gate electrodes of said memory transistor and said selecting transistor, wherein driving force of said memory transistor or said selecting transistor whichever faces said bit line is enhanced, wherein said memory transistor/said selecting transistor which faces said bit line lies on a drain side of any one of said memory cells, and wherein a gate oxide film of said memory transistor/said selecting transistor which lies on said drain side is smaller than a gate oxide film of said selecting transistor/said memory transistor which faces said source side.

12. The nonvolatile semiconductor memory device according to claim 11, wherein a ratio in gate oxide film thickness of said selecting transistor/said memory transistor which faces said source side and said memory transistor/said selecting transistor which lies on said drain side is from about 1:0.5 to 1:0.95.

13. A nonvolatile semiconductor memory device comprising a plurality of memory cells connected in parallel with each other each of which has a memory transistor and a selecting transistor connected in series between a bit line and a source electrode, in such a configuration that information can be, via said bit line, input to and output from any one of said memory cells which is selected by a word line connected to gate electrodes of said memory transistor and said selecting transistor, wherein driving force of said memory transistor or said selecting transistor whichever faces said bit line is enhanced, wherein driving force of said memory cells are set so that balance in load voltage is kept between said memory transistor and said selecting transistor.

* * * * *